US008881522B2

(12) United States Patent
Jebasinski et al.

(10) Patent No.: US 8,881,522 B2
(45) Date of Patent: Nov. 11, 2014

(54) EXHAUST MANIFOLD

(75) Inventors: Rolf Jebasinski, Filderstadt (DE); Georg Wirth, Kirchheim/Teck (DE)

(73) Assignee: J. Eberspaecher GmbH & Co. KG, Esslingen (DE)

( * ) Notice: Subject to any disclaimer, the term of this patent is extended or adjusted under 35 U.S.C. 154(b) by 223 days.

(21) Appl. No.: 13/371,583

(22) Filed: Feb. 13, 2012

(65) Prior Publication Data

US 2012/0204557 A1 Aug. 16, 2012

(30) Foreign Application Priority Data

Feb. 16, 2011 (DE) .......................... 10 2011 004 243

(51) Int. Cl.
*F02B 33/44* (2006.01)
*F01N 3/02* (2006.01)
*H01L 35/30* (2006.01)
*F01N 5/02* (2006.01)
*F01N 13/10* (2010.01)

(52) U.S. Cl.
CPC ........... *F01N 13/10* (2013.01); *F01N 5/02* (2013.01); *Y02T 10/166* (2013.01); *H01L 35/30* (2013.01); *Y02T 10/16* (2013.01)
USPC .............................. 60/605.1; 60/321; 136/205

(58) Field of Classification Search
USPC ................ 60/274–324, 605.1; 136/200–242
See application file for complete search history.

(56) References Cited

U.S. PATENT DOCUMENTS

| 2,977,940 A | * | 4/1961 | Theriault | 123/25 B |
| 6,986,247 B1 | | 1/2006 | Parise | |
| 7,150,147 B2 | * | 12/2006 | Murata | 60/287 |
| 2002/0139123 A1 | * | 10/2002 | Bell | 136/204 |
| 2005/0072165 A1 | * | 4/2005 | Bell | 136/230 |
| 2005/0172992 A1 | * | 8/2005 | Shimoji et al. | 136/208 |
| 2006/0162326 A1 | * | 7/2006 | Nakagawa | 60/322 |
| 2010/0269878 A1 | | 10/2010 | Kuhlbach | |
| 2011/0146743 A1 | * | 6/2011 | Oesterle et al. | 136/210 |

FOREIGN PATENT DOCUMENTS

| DE | 10 2009 058 948 A1 | 6/2001 | |
| DE | 603 10 131 T2 | 9/2007 | |
| EP | 2 180 534 A1 | 4/2010 | |
| JP | 11-122960 A | 4/1999 | |
| JP | 11257064 A * | 9/1999 | ................ F01N 3/24 |
| JP | 2004-360522 A | 12/2004 | |
| JP | 2007-263026 A | 10/2007 | |
| WO | WO 2010/112571 A2 | 10/2010 | |

* cited by examiner

*Primary Examiner* — Thai Ba Trieu
*Assistant Examiner* — Ngoc T Nguyen
(74) *Attorney, Agent, or Firm* — Reinhart Boerner Van Deuren P.C.

(57) ABSTRACT

The present invention relates to an exhaust manifold (15) for an exhaust system (5) of a combustion engine (1), in particular of a motor vehicle, with an exhaust channel (16) for conducting exhaust gas, which comprises an inlet side (17) that can be connected to the combustion engine (1) and an outlet side (19) that can be connected to the exhaust system (5), and with at least one coolant channel (20) for conducting coolant, which is arranged on the outside of the exhaust channel (16) and can be connected to a cooling circuit (6).

In order to reduce the thermal load on the exhaust manifold (15), at least one thermoelectric converter (22) can be provided, which on the one hand is coupled to the exhaust channel (16) and on the other hand to the coolant channel (20) in a heat-transferring manner.

15 Claims, 4 Drawing Sheets

EXHAUST MANIFOLD

CROSS-REFERENCE TO RELATED PATENT APPLICATION

This patent application claims priority to German Application No. 102011004243.1-13, filed Feb. 16, 2011, the entire teachings and disclosure of which are incorporated herein by reference thereto.

FIELD OF THE INVENTION

The present invention relates to an exhaust manifold for an exhaust system of a combustion engine, in particular of a motor vehicle. The invention additionally relates to a combustion engine equipped with at least one such exhaust manifold. Finally, the present invention additionally relates to a method for operating such a combustion engine.

BACKGROUND OF THE INVENTION

Exhaust manifolds are generally known and serve in combustion engines for collecting and combining the exhaust gases discharged from the cylinders of the combustion engine. Usually, such an exhaust manifold comprises an exhaust channel for conducting the exhaust gas which comprises an inlet side that can be connected to the combustion engine and an exhaust side that can be connected to the exhaust system. In the case of combustion engines having a plurality of cylinders, the inlet side can have a corresponding number of individual inlet pipes, via which the exhaust gas reaches a common collecting region of the exhaust channel from the cylinders of the combustion engine. The exhaust side usually comprises a common outlet, via which the connection to the remaining exhaust system is established.

Through the arrangement of the exhaust manifold directly on the combustion engine, the exhaust manifold is exposed to a particularly high thermal load. There is therefore the need to reduce the thermal load on such an exhaust manifold and in particular utilise the heat present there.

The present invention deals with the problem of stating an improved embodiment for an exhaust manifold of the type mentioned at the outset for a combustion engine equipped with such a manifold, which is characterized in particular by an increased lifespan. Preferentially, the thermal load on the exhaust manifold is to be reduced. The aim, furthermore, is to improve the energetic efficiency of the respective combustion engine.

SUMMARY OF THE INVENTION

According to the invention, this problem is solved through the subjects of the independent claims. Advantageous embodiments are the subject of the dependent claims.

The invention is based on the general idea of equipping the exhaust manifold with at least one thermoelectric converter. With the help of such a thermoelectric converter the temperature differential between the exhaust channel and the surroundings or a coolant channel can be utilised for generating an electric voltage and thus for generating electric energy. This produces a huge additional benefit for the cooled exhaust manifold, since electric energy can be won, in that a part of the heat carried along in the exhaust gas is converted into electric energy. Thus, through the introduced exhaust manifold, the energetic efficiency of the combustion engine equipped with such an exhaust manifold can be improved. In addition to this, the thermal load on the exhaust manifold is reduced through the attachment of the at least one thermoelectric converter, since a part of the heat is converted into electric energy. The advantages of an energy recovery in the form of a conversion of the heat into electric energy compared with a simple discharge of the heat via the cooling circuit are obvious. For example, the electric energy can be intermediate-stored and for example converted into drive energy in a particularly simple manner.

Particularly advantageous now is an embodiment, wherein the exhaust manifold is additionally connected to a cooling circuit in order to be able to thus actively cool the exhaust manifold, which drastically reduces the thermal load on the exhaust manifold. In order to be able to cool the exhaust manifold with the help of a cooling circuit, the exhaust manifold is equipped with at least one coolant channel for conducting coolant, which is arranged on the outside of the exhaust channel and which can be connected to said cooling circuit. In particular, this coolant channel can in particular completely or largely completely cover or envelope the exhaust channel on its outside over a large area. Because of this, a lot of heat can be transferred in particular. Additionally noteworthy with this embodiment is that for achieving an adequate cooling output on or in the exhaust manifold altogether less cooling output has to be realised via the cooling circuit, since a considerable part of the cooling output can be generated with the help of the respective thermoelectric converter. Thus the cooling requirement that has to be provided via the cooling circuit can be reduced. According to an advantageous embodiment, a control for operating the at least one thermoelectric converter can be provided, which during a hot operation of the combustion engine operates or activates the respective thermoelectric converter corresponding to the Seebeck effect for generating electric energy and which during a cold start operation of the combustion engine operates or activates the respective thermoelectric converter in accordance with the Peltier effect for generating heat.

According to an advantageous embodiment, at least one such coolant channel can be equipped as pressure body and press the thermoelectric converter against the exhaust channel. Through this mutual pressing-on the respective contact area between the mentioned components that is decisive for the heat transfer is enlarged or homogenised, which improves the heat transfer between exhaust channel and thermoelectric converter on the one hand and between coolant channel and thermoelectric converter on the other hand. The pressing-on of the coolant channel configured as pressure body can more preferably be realised using spring force, so that for example thermally-induced relative movements are more easily possible.

With an advantageous further development, the respective coolant channel can comprise at least one outer shell for supporting preload forces and an inner shell for supporting the respective coolant channel directly or indirectly on the respective thermoelectric converter. Because of this, the respective coolant channel has at least a two-shell construction, which simplifies the manufacture. Furthermore, outer shell and inner shell can be specifically adapted to the respective function. For example, the outer shell can be configured stiffer than the inner shell, e.g. as pressure plate. The inner shell can have a preload contour, which supports the generation of the desired pressure-on forces.

According to a further advantageous further development, at least one tensile anchor for introducing the preload forces into the respective outer shell can be provided, which is arranged on the respective coolant channel such that it penetrates the inner shell and the outer shell and is supported on an outer side of the outer shell facing away from the inner shell. Thus, the respective tensile anchor is passed through an interior space of the coolant channel in a space-saving manner in which in operation of the exhaust manifold the respective coolant is conducted. This proposal leads to a compact design.

With another further development it can be provided that the respective coolant channel for the respective tensile anchor comprises a sleeve, which separates a through-opening penetrated by the respective tensile anchor from an interior space of the respective coolant channel through which coolant can flow. The respective sleeve thus generates a passage in the respective coolant channel that is fluid-tight against the interior space, so that the respective tensile anchor can be passed through the respective through-opening in a particularly simple manner.

Practically, at least two coolant channels configured as pressure body can be provided, between which the exhaust channel and the respective thermoelectric converter are arranged and which are preloaded towards each other in order to press the thermoelectric converter against the exhaust channel. Because of this, the preloading forces on the two pressure bodies or on the two coolant channels can be removed without an additional, in particular one-sided, load on the exhaust channel, on the respective thermoelectric converter and on the coolant channels being created in the process. Preferentially, the two coolant channels are preloaded towards each other by means of spring force so that here, too, thermally-induced relative movements between the individual components are simplified.

In order for the respective coolant channel to be able to press the respective thermoelectric converter against the exhaust channel a loose arrangement of the thermoelectric converter on the exhaust channel and of the coolant channel on the thermoelectric converter is practically provided, which permits relative movements of these components towards each other.

Here, an embodiment is particularly advantageous, wherein between the two coolant channels configured as pressure bodies at least two thermoelectric converters are arranged on both sides of the exhaust channel and pressed against each other with the help of the coolant channels. Thus, the heat on the exhaust channel can be discharged on both sides and thus over a large area. Insofar, the thermal load on the gas channel can be homogenised or configured symmetrical.

With another advantageous embodiment, the two coolant channels can be preloaded towards each other with the help of at least one tensile anchor. Independently of whether two coolant channels preloaded towards each other or only one coolant channel are provided, the material elasticities of the tensile anchor and/or of the respective coolant channel provide adequate spring elasticity in order to offset thermally-induced relative movements. Practically, however, the respective tensile anchor can comprise at least one spring element or be formed by at least one spring element, wherein the respective spring element can be configured in particular as wave spring, as bellows spring, as C-spring, as $\Omega$-spring, as disc spring or as tube spring. Such spring elements can offset thermally-induced relative movements between the coolant channels and the components preloaded towards each other by these in a particularly favourable manner while maintaining the required preload. Here, the respective coolant channel is practically arranged moveable in the preload direction at least relative to the exhaust channel.

As already mentioned, according to another advantageous embodiment, the respective coolant channel can comprise at least one outer shell for supporting the preload forces, in particular on a further coolant channel, and an inner shell for supporting the respective coolant channel on the respective thermoelectric converter. The configuration as multi-part shell body makes it possible for example to configure the outer shell as pressure body and the inner shell as preload body. The outer shell then practically has an increased bending stiffness compared with the inner shell, while the inner shell can have a preload contour, for example in the form of a convex curvature facing the exhaust channel. The configuration of the outer shell as pressure plate simplifies the generation of the desired preload, since such a pressure plate can be designed sufficiently stiff and thus self-supporting. The resiliently yielding configuration of the inner shell improves the homogenous pressing-on of the respective thermoelectric converter on the one hand against the exhaust channel and on the other hand against the respective coolant channel.

According to a further embodiment, the respective thermoelectric converter can be annularly enclosed by a thermal insulation between the exhaust channel and the respective coolant channel. Via its face ends facing away from each other, the respective thermoelectric converter is thus in connection in a heat-transferring manner on the one hand with the exhaust channel and on the other hand with the coolant channel, while it is thermally insulated on the circumference. Because of this, the heat flow is concentrated on the respective thermoelectric converter, which improves the effectiveness of the entire arrangement. Insofar as a plurality of thermoelectric converters is present, adjacent thermoelectric converters are thermally insulated against each other. Here, too, the provided thermal insulation results in that the heat flow is concentrated on the individual thermoelectric converters, which improves the efficiency of the arrangement.

Advantageously, a plurality of thermoelectric converters can be arranged distributed along the outside of the exhaust channel, which are electrically interconnected via a cabling. The use of a plurality of thermoelectric converters makes it possible to make use of commercially available, cost-effective thermoelectric converters in order to be able to arrange these distributed along the outside of the exhaust channel. In particular, the arrangement of the thermoelectric converter can be adapted to any geometrical shape of the exhaust channel because of this.

According to another advantageous embodiment, the respective thermoelectric converter can be connected to an electric cabling, which is led out of the exhaust manifold, for example in order to be able to connect the respective thermoelectric converter to a voltage converter or the like. Here, the cabling advantageously comprises a metal tube and at least two electric conductors which are electrically insulated and installed in the metal tube. Because of this, an effective thermal protection can be created for the electric conductors or for their electrical insulation. In particular, the conductors in this case can be embedded within the metal tube in an electrically insulating mass. This can preferentially be an electrically insulating powder, which is compressed in the metal tube together with the electric conductors. Such an electrically insulating powder can for example be produced from a ceramic, such as for example magnesium oxide.

According to another advantageous embodiment, the exhaust channel can comprise at least one stiffening structure on its inside for stiffening the exhaust channel. Such a stiffening structure can be configured for example as bead or rib or web. Through the stiffening of the exhaust channel comparatively large pressures or preloads can be achieved and supported on the exhaust channel in order to press the thermoelectric converters against the respective coolant channel and against the exhaust channel via the respective coolant channel. Particularly advantageous here is a further development, wherein at least one such stiffening structure supports two walls of the exhaust channel located opposite each other on each other. Because of this, particularly large forces can be supported while the walls of the exhaust channel can have comparatively thin wall thicknesses at the same time.

Additionally or alternatively it can be provided that the exhaust channel on its inside comprises at least one heat transfer structure for improving the heat transfer between exhaust gas channel and exhaust gas. Because of this, the effectiveness of the heat transfer and thus of the thermoelectric converters can be improved. Suitable heat transfer structures are for example turbulators, ribs, lamellae, baffle plates, fins and the like.

Particularly practical now is a version, wherein the previously mentioned at least one stiffening structure for stiffening the exhaust channel is additionally configured as such a heat transfer structure for improving the heat transfer between exhaust channel and exhaust gas. Because of this, the stiffening structure or the heat transfer structure receives a dual function, without more installation space being required.

The problem on which the invention is based is thus also solved with the help of a combustion engine, which comprises at least one exhaust manifold of the prescribed typed. Furthermore, the combustion engine also comprises at least one exhaust system which is connected to said exhaust manifold, namely on its exhaust side. With this combustion engine, the respective coolant channel is connected to a cooling circuit.

According to another advantageous embodiment, the combustion engine can comprise a cooling circuit, e.g. for cooling an engine block of the combustion engine, wherein the respective coolant channel is practically connected to this cooling circuit of the combustion engine. It is clear that the respective coolant channel of the exhaust manifold in this case can be connected to the main strand or a subsidiary strand of the cooling circuit of the combustion engine.

Alternatively it can be provided with a further embodiment that the combustion engine can have a cooling circuit for cooling an engine block of the combustion engine, but wherein the respective coolant channel is connected to a cooling circuit that can be controlled separately from the cooling circuit of the combustion engine. This can in particular be a cooling circuit other than the cooling circuit for cooling the engine block. Likewise, it can be a separately controllable subsidiary circuit of the cooling circuit provided for cooling the engine block.

With another embodiment it can be provided for example that the cooling circuit connected to the respective coolant channel comprises a coolant pump, wherein a control is provided that is so configured or programmed that it controls a rate of delivery of the coolant pump dependent on the cooling requirement of the respective coolant channel. Because of this, the electric energy that can be generated with the respective thermoelectric converter can be provided as a function of demand.

According to a further advantageous embodiment, an exhaust gas turbocharger can be provided that is connected to a cooling circuit, to which the respective coolant channel is likewise connected. Insofar as a cooled exhaust gas turbocharger is provided, which is practically connected directly to the exhaust manifold, an extreme simplification with regard to the line routing is obtained if the respective coolant channel of the exhaust manifold and the exhaust gas turbocharger are connected to the same cooling circuit.

The problem on which the invention is based is also solved through a method for operating such a combustion engine.

During a hot operation of the combustion engine, which is the case at least when all substantial components have reached their usual operating temperature, the respective thermoelectric converter is operated for generating electric energy. In other words, the temperature differential that materialises between exhaust channel and coolant channel during the hot operation is utilised for generating an electric voltage and thus for the take-off of electric power subject to the utilisation of the Seebeck effect.

At least during a cold-start operation of the combustion engine, which is the case at least when during starting of the combustion engine substantial components are at ambient temperature, the respective thermoelectric converter is operated inversely, i.e. in such a manner that it converts electric energy into heat and thus contributes to the heating of the exhaust channel. In other words, the electric voltage applied to the respective thermoelectric converter during the cold operation is utilised for generating a heat transport between exhaust channel and coolant channel subject to the utilisation of the Peltier effect. Thus, the time that is required for heating components of the exhaust system relevant to exhaust gas cleaning to their operating temperature can be reduced, which reduces the pollutant emission of the combustion engine. In principle, states, which require heat being introduced into the exhaust line are also conceivable during the hot operation, for example for a regeneration operation of an exhaust gas treatment device.

Further important features and advantages of the invention are obtained from the subclaims, from the drawings and from the associated Figure description by means of the drawings.

It is to be understood that the features mentioned above and still to be explained in the following cannot only be used in the respective combination stated but also in other combinations or by themselves without leaving the scope of the present invention.

BRIEF DESCRIPTION OF THE DRAWINGS

Preferred exemplary embodiments of the invention are shown in the drawings and are explained in more detail in the following description, wherein same reference characters refer to same or similar or functionally same components.

It shows, in each case schematically.

DETAILED DESCRIPTION OF THE INVENTION

Figure 1:
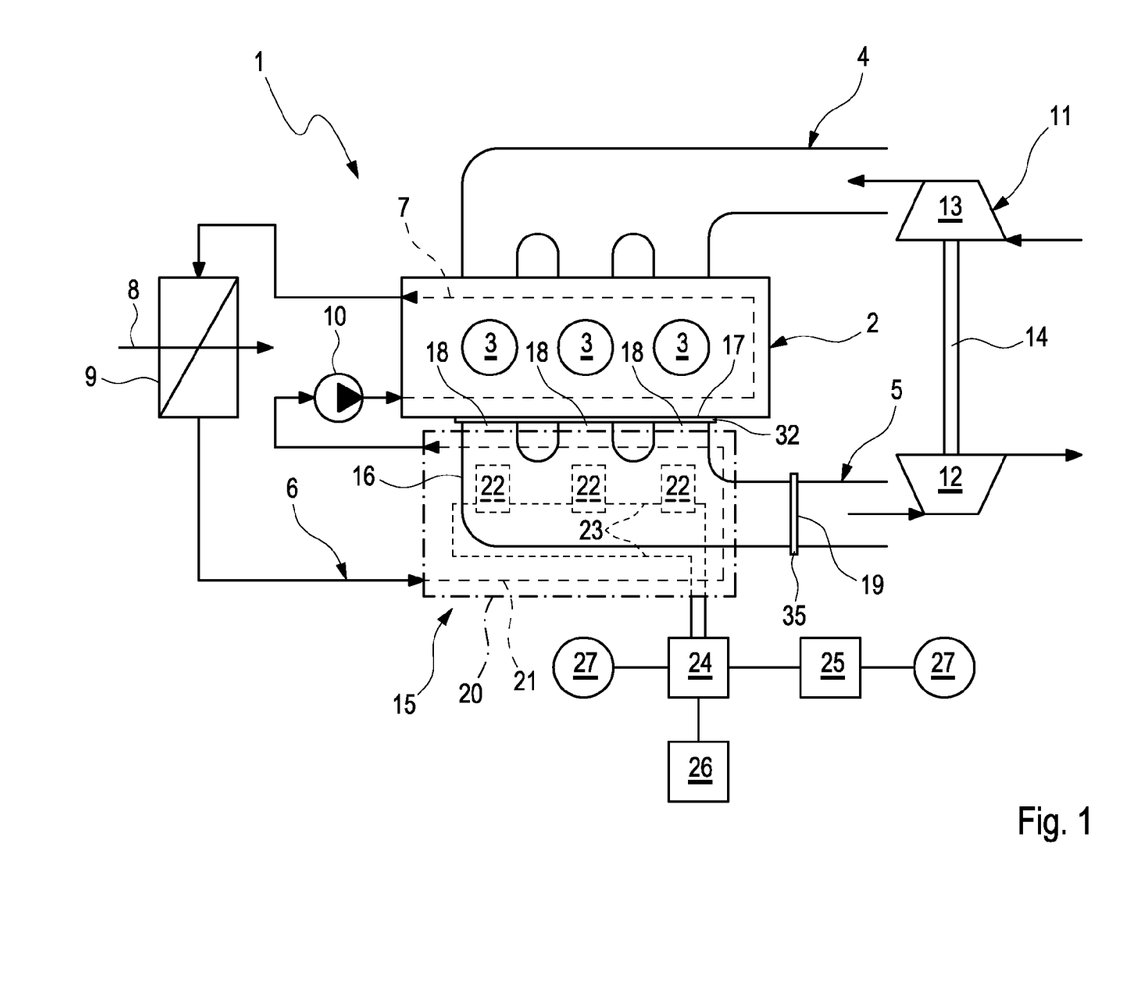
FIG. 1 a highly simplified representation in the manner of a circuit diagram of a combustion engine with an exhaust manifold, FIG. 2 a representation as in FIG. 1, however with another embodiment of the combustion engine, FIG. 3 a highly simplified view of the exhaust manifold, FIG. 4 a highly simplified cross section of the exhaust manifold corresponding to section lines IV in FIG. 3, FIG. 5 a highly simplified cross section of the exhaust manifold corresponding to section lines V in FIG. 4.
Figure 2:
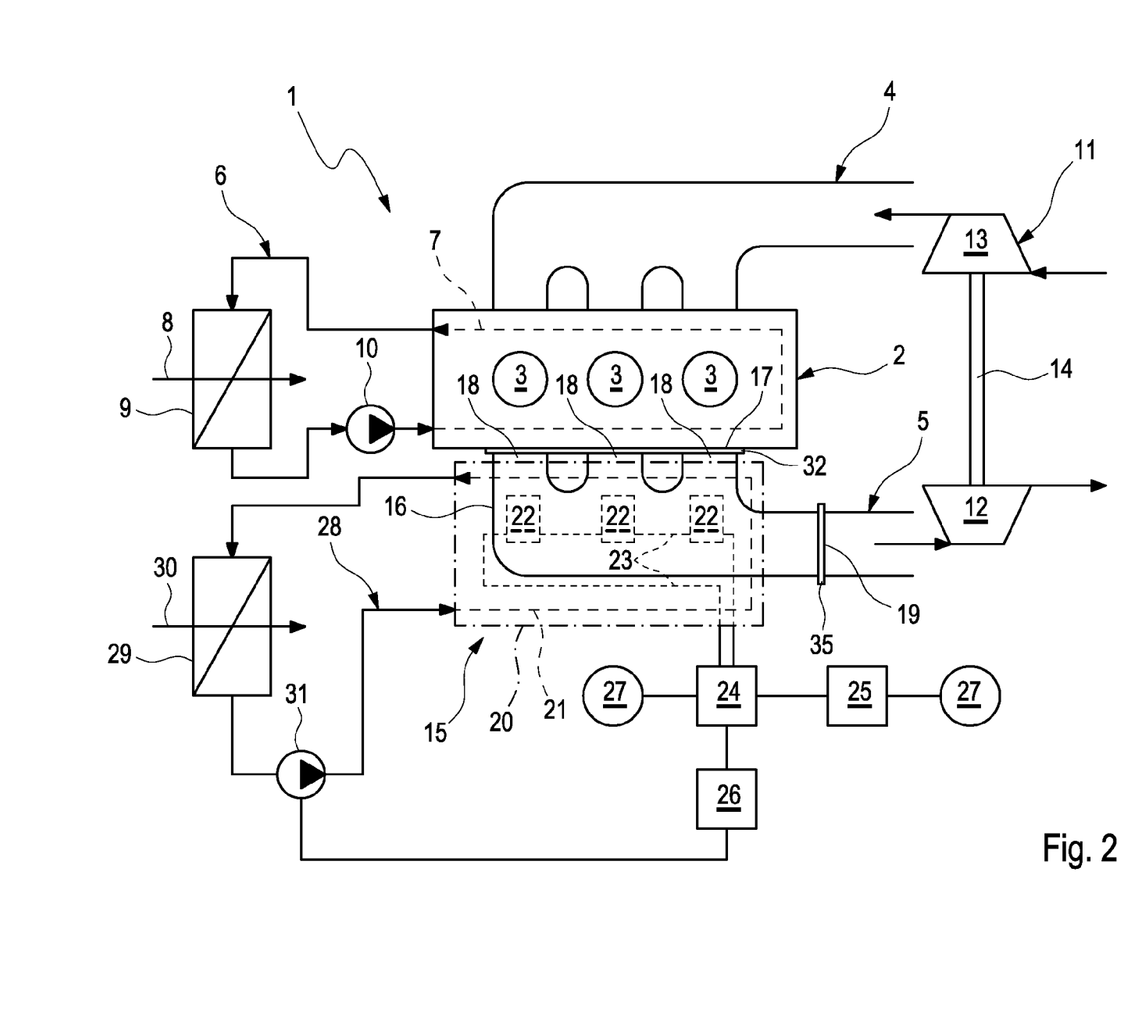

According to FIGS. 1 and 2, a combustion engine 1 comprises an engine block 2 with a plurality of cylinders 3, a fresh air system 4 for feeding fresh air to the cylinders 3 and an exhaust system 5 for discharging exhaust gas from the cylinders 3. The combustion engine 1 furthermore is equipped with a cooling circuit 6, which comprises at least one cooling path 7 routed the engine block 2, a radiator 9 exposed to a cooling air flow 8 and a pump 10 for driving the coolant.

In the shown example, the combustion engine 1 is additionally equipped with an exhaust gas turbocharger 11 whose turbine 12 is incorporated in the exhaust system 5, whose compressor 13 is incorporated in the fresh air system 4 and whose shaft 14 connects a turbine wheel of the turbine 12 with a compressor wheel of the compressor 13 which is not shown in a rotationally fixed manner.

The exhaust system 5 is connected to the engine block 2 via an exhaust manifold 15. The exhaust manifold 15 according to FIGS. 1 to 5 comprises an exhaust channel 16, which serves for conducting exhaust gas from the cylinders 3 of the engine block 2 to the exhaust system 5. The exhaust channel 16 has an inlet side 17, wherein the exhaust channel 16 can be or is connected to the combustion engine 1 or to its engine block 2. In the shown example, the inlet side 17 comprises a plurality of inlet pipes 18, each of which is assigned to a cylinder 3 of the engine block 2. Furthermore, the exhaust channel 16 comprises an exhaust side 19 wherein the exhaust channel 16 can be or is connected to the exhaust system 5.

The exhaust manifold 15 additionally comprises at least one coolant channel 20, which serves for conducting a coolant, which is arranged on the exhaust channel 16, i.e. on a side facing away from the exhaust gas and which can be or is connected to a cooling circuit. The respective coolant channel 20 defines a coolant path 21 which leads through the exhaust manifold 15.

In the shown example of FIG. 1, the coolant channel 20 is connected to the cooling circuit 6 of the combustion engine 1. In contrast with this, FIG. 2 shows a preferred embodiment, wherein the respective coolant channel 20 is connected to a cooling circuit 28 other than the cooling circuit 6 of the combustion engine 1. With connected cooling circuit 6 or 28, the coolant channel 20 is incorporated in this cooling circuit 6 or 28. The additional cooling circuit has a separate radiator 29, which can likewise be exposed to an air flow 30 and practically has its own coolant pump 31. This coolant pump 31 can be practically coupled to a control 26, which will still be explained in more detail further down below.

The exhaust manifold 15 is additionally equipped with at least one thermoelectric converter 22. The respective thermoelectric converter 22 is coupled on the one hand to the exhaust channel 6 and on the other hand to the coolant channel 20 in a heat-transferring manner. With the embodiments shown here, a plurality of such thermoelectric converters 22 are provided in each case, which are electrically coupled or connected to each other via a cabling 23. This cabling 23 is led out of the exhaust manifold 15 and for example connected to a voltage regulator or voltage converter 24. The voltage regulator 24 can in turn be electrically connected to an electric energy storage unit 25, e.g. in the form of a battery, and a control 26 can furthermore be provided, which is coupled to the voltage regulator 24 for example in order to activate the latter. Any electrical consumers 27 can now be connected either directly to the voltage regulator 24 or to the energy storage unit 25.

According to FIGS. 1 to 4, the exhaust manifold 15 comprises for example an inlet flange 32, with the help of which the fastening of the exhaust manifold 15 to the engine block 2 can be realised, and an exhaust flange 35, which facilitates fastening the exhaust manifold 15 to the exhaust system 5. In particular, it is possible to directly connect the exhaust manifold 15 according to FIG. 3 on the outlet side to the turbine 12 of the exhaust gas turbocharger 11.

At least one of the coolant channels 20 is configured as pressure body. In the example, both coolant channels 20 are each configured as pressure body. The coolant channels 20 are arranged on the outside, i.e. on a side facing away from the exhaust gas or from the exhaust channel 16. The attachment of the respective coolant channel 20 to the exhaust manifold 15 in this case is performed such that through the coolant channel 20 the respective thermoelectric converter 22 is pressed against the exhaust channel 15. This pressing-on or this preload can in particular be realised by means of spring force.

Figure 3:
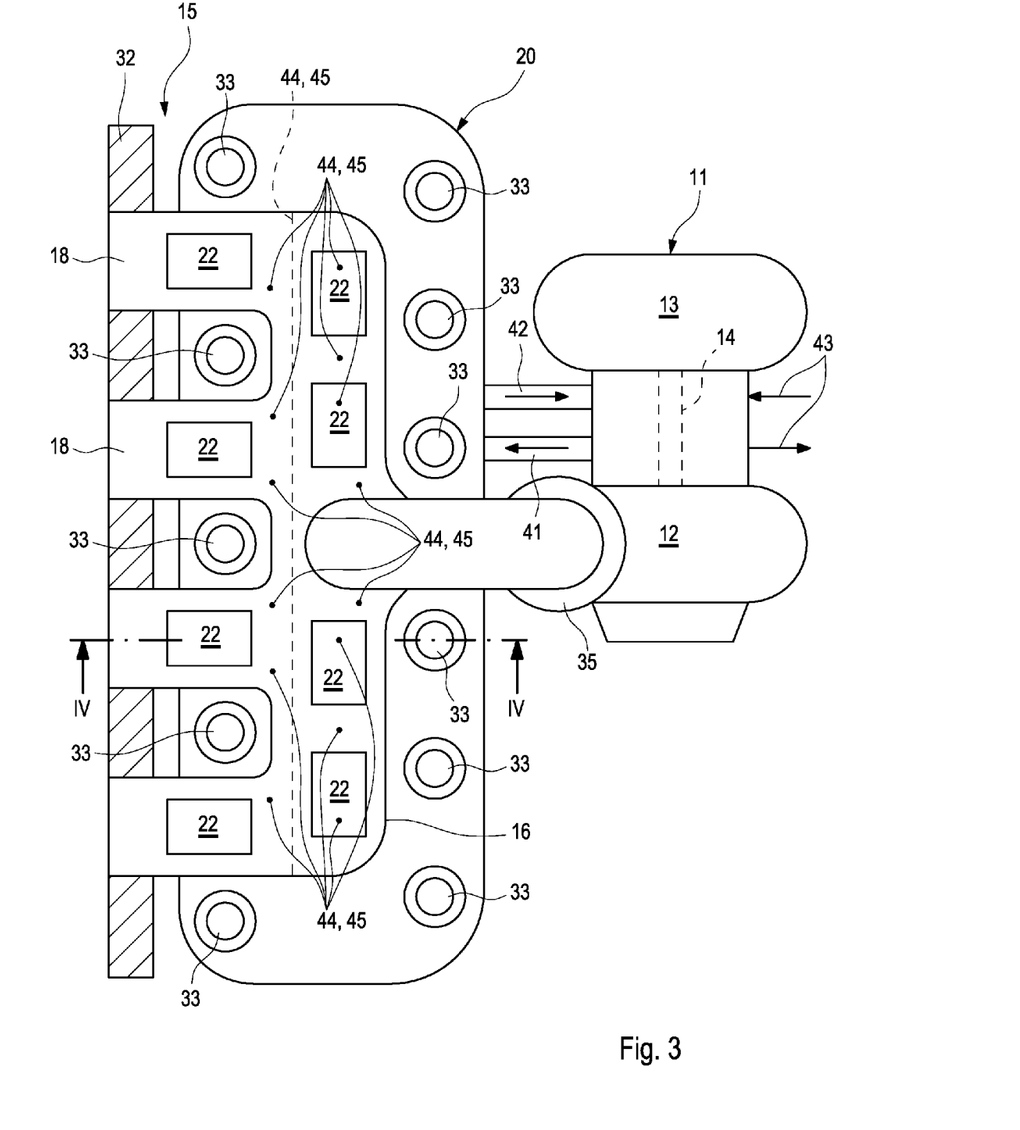
Figure 4:
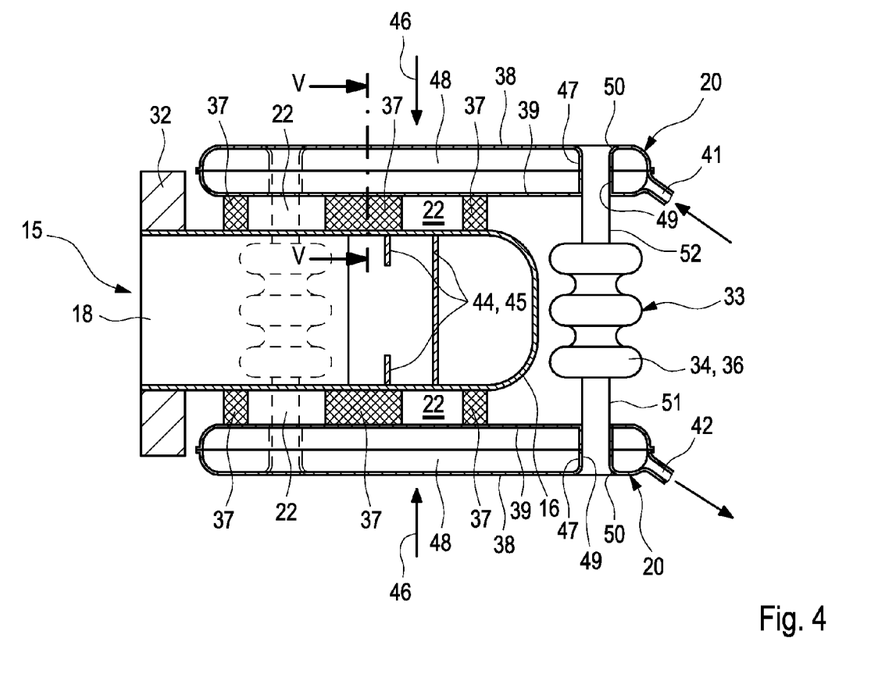

As can be seen in particular from FIG. 4, at least two such coolant channels 20 configured as pressure body are provided, wherein the exhaust channel 16 and the respective thermoelectric converter 22 are arranged between these two coolant channels 20 configured as pressure body. The two coolant bodies 20 are preloaded towards each other, as a result of which the coolant channel 20 is pressed against the respective thermoelectric converter 22 and the respective thermoelectric converter 22 against the exhaust channel 16. With the embodiments of FIGS. 3 and 4, at least two thermoelectric converters 22 are arranged between the two coolant channels 20 each on both sides of the exhaust channel 16 and pressed against each other with the help of the coolant channels 20. In the section of FIG. 4, two thermoelectric converters 22 are noticeable next to each other on each side of the exhaust channel 16.

For generating the preload of the two coolant channels 20 against each other or the respective coolant channel 20, spring forces are practically active which are generated for example with the help of tensile anchors 33. For example, FIGS. 3 and 4 show embodiments, wherein the two coolant channels 20 are preloaded towards each other with the help of a plurality of tensile anchors 33. To this end, the respective tensile anchor 33 can comprise at least one spring element 34 for example at least on one of its ends or between its ends. For example, the respective spring element 34 in the case of FIG. 4 can be formed by a bellows spring 36. In principle, other suitable spring elements 34 are also conceivable, e.g. in a wave spring, a C-spring, a Ω-spring or a pipe spring.

The tensile anchors 33 according to FIG. 3 are practically distributed as evenly as possible in order to achieve an even preloading of the coolant channels against each other. According to FIG. 4, the tensile anchors 33 penetrate the respective coolant channel 20 in order to support themselves on the respective side facing away from the exhaust channel 16.

In principle it is also possible to combine the two coolant channels 20 into a common shell housing, so that the two coolant channels 20 then each form a housing shell. These coolant channels 20 configured as housing shells can enclose the remaining components of the exhaust manifold 15, i.e. in particular the thermoelectric converters 22 and the exhaust channel 16 like a common housing. In marginal regions, these housing shell-coolant channels 20 can bear against each other and be preloaded towards each other with the help of spring elements or fixed to each other with the help of suitable fastening elements. The spring-elastic preload can then be generated by the material elasticity of the housing shell-coolant channels 20 itself. Purely exemplarily, the housing shell-coolant channels 20 can be preloaded towards each other and/or fixed to each other by means of C-shaped or U-shaped or Ω-shaped clamps.

As is evident from FIG. 4, the individual thermoelectric converters 22 are practically annularly enclosed by a thermal insulation 37. Here, the respective insulation 37 surrounds the thermoelectric converter 22 on the circumference, i.e. along a lateral margin which is located between the axial face ends of the respective thermoelectric converter 22 facing away from each other, via which face ends the respective thermoelectric converter 22 is in areal contact with the exhaust channel 16 or with the respective coolant channel 20.

The heat-transferring contacting between the respective thermoelectric converter 22 and the exhaust channel 16 on the one hand and between the respective thermoelectric converter 22 and the respective coolant channel 20 on the other hand can be effected via a direct body contact or preferentially via a heat conductive material, wherein the respective heat conductive material can be realised for example in the form of a paste or in the form of a shaped body or in the form of a foil.

The insulation 37, which encloses the thermoelectric converter 22, can be configured as shaped body that can be simultaneously utilised for positioning the thermoelectric converter 22. Furthermore, the cabling 23 can be integrated in this shaped body. Thus, the manufacture of the exhaust manifold 15 is simplified.

According to FIG. 4, it can be provided according to an advantageous embodiment, that the exhaust channel 16 on its inside facing away from the thermoelectric converters 22 or facing the exhaust gas comprises at least one stiffening structure 44 for stiffening the exhaust channel 16. Such a stiffening structure 44 can for example be formed through a rib or a web. Through the stiffening of the exhaust channel 16, comparatively large pressures or preloads can be supported on the exhaust channel 16, in order to press the thermoelectric converters 22 against the coolant channels 20 and against the exhaust channel 16 via the coolant channels 20. Particularly advantageously, at least one such stiffening structure 44 in the example is configured for example in the form of a rod or a column, such that it supports two walls of the exhaust channel 16 located opposite each other against each other. Because of this, particularly large forces can be supported, while the walls of the exhaust channel 16 can have comparatively thin wall thicknesses at the same time.

Additionally or alternatively it can be provided that the exhaust channel 16 on its inside comprises at least one heat transfer structure 45 for improving the heat transfer between exhaust channel 16 and exhaust gas. Suitable heat transfer structures 45 are for example turbulators, ribs, lamellae, baffle plates, fins and the like. In the shown example, at least the rod-shaped or column-shaped stiffening structure 44 is additionally designed so that it acts as heat transfer structure 45. Because of this, the stiffening structure 44 is given a dual function, without requiring more installation space. In FIG. 3, a plurality of such stiffening structures 44 configured as rod, pillar or support are indicated purely exemplarily, which can simultaneously serve as heat transfer structures 45. To this end, the rod-shaped stiffening structures 44 can be provided with lamellae or baffle plates or ribs. Furthermore, a stiffening structure 44 extending over a plurality of cylinders 3 is noticeable, which can likewise be designed as heat transfer structure 45.

Figure 5:
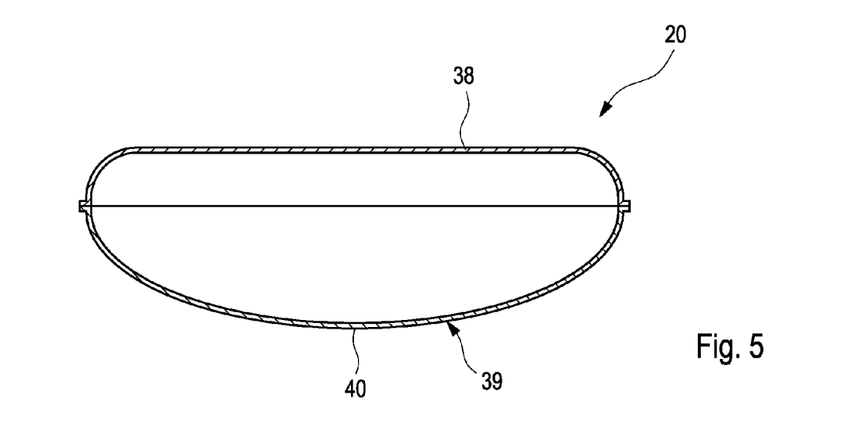

According to FIG. 5, the respective coolant channel 20 can comprise at least one outer shell 38 for supporting the preload forces and an inner shell 39 for supporting the respective coolant channel 20 on the respective thermoelectric converter 22. The configuration of the respective coolant channel 20 as multi-part shell body makes it possible for instance to configure the outer shell 38 as pressure body and configure the inner shell 39 as preload body. Compared with the inner shell 39, the outer shell 38 then practically has an increased bending stiffness. This can be realised for example through a greater wall thickness and/or through stiffening ribs and the like. In contrast with this, the inner shell 39 can comprise a preload contour 40. In the example of FIG. 5, this preload contour has the shape of a convex curvature facing the exhaust channel 16. The configuration of the outer shell 38 as pressure body or pressure plate simplifies the generation of the desired preload, since such a pressure plate is sufficiently stiff and can thus be designed in a self-supporting manner. The resiliently yielding configuration of the inner shell 39 improves the homogeneous pressing-on of the respective thermoelectric converter 22 against the exhaust channel 16 on the one hand and against the respective coolant channel 20 on the other hand.

In FIG. 4, the preload forces, with which the respective coolant channel 20 presses the respective thermoelectric converter 22 against the exhaust channel 16 is indicated by arrows. As is additionally evident from FIG. 4, the tensile anchors 33, with which the two coolant channels 20 are preloaded towards each other for generating the preload forces 46, are each passed through the two coolant channels 20. To this end, a sleeve 47 is provided in the respective coolant channel 20, which extends in an interior space 48 of the coolant channel 20 from the outside 38 to the inside 39 and in the process encloses or defines a through-opening 49. Because of this, the sleeve 47 separates the interior space 48 through which coolant can flow from the through-opening 49. Through the respective through-opening 49, such a tensile anchor 33 can now be passed in such a manner that the respective tensile anchor 33 can now support itself on an outer side of the outer shell 38 facing away from the inner shell 39. The support between outer shell 38 and tensile anchor 33 is effected through positive connection in the shown example of FIG. 4. To this end, the respective through-opening 49 has a funnel-shaped inlet contour 50 on the outer shell 38. The associated end of the tensile anchor 33 is shaped complementarily thereto. In the case of a tubular tensile anchor 33, this contour can be particularly easily realised through a funnel-like flare. In the example of FIG. 4, the respective tensile anchor 33 consists of multiple parts and comprises for example two pipe pieces 51, 52, which are interconnected with the help of the spring element 34 and preloaded towards each other.

In FIGS. 3 and 4, an advance connection 41 leading to the respective coolant channel 20 and a return connection 42 leading away from the respective coolant channel 20 are noticeable, via which the respective coolant channel can be connected to the respective cooling circuit 6 and 28 respectively. FIG. 3 shows a particular embodiment, wherein the connections 41 and 42 are used in order to connect the respective coolant channel 20 to a cooling circuit 43, to which the exhaust turbocharger 11 is likewise connected. Because of this, an assembly that is integrated in particular with respect to the coolant routing can be created, which reduces the effort for conducting the coolant. The cooling circuit 43 for cooling the exhaust gas turbocharger 11 can be the cooling circuit 6 of the combustion engine 1 or a subsidiary branch of this cooling circuit 6. It can also be a cooling circuit 28 that can be controlled independently of the cooling circuit 6 of the combustion engine 1.

For a cold-start operation, the combustion engine 1 is practically operated so that the control 26 activates the converter 24 so that it operates the thermoelectric converter 22 for utilising the Peltier effect. To this end, the converter 24 applies an electric voltage to the thermoelectric converter 22 via the cabling 23, which the converter 24 preferentially draws from the energy storage unit 25. The thermoelectric converters 22 operated thus now convert the electric energy into heat and can heat up the exhaust channel 16 because of this. By doing so, the exhaust manifold 15 introduced here contributes to the shortening of the cold start operation.

During the normal hot operation of the combustion engine 1, the thermoelectric converters 22 are then operated for utilising the Seebeck effect, i.e. for generating electric energy, which can then be fed to the consumers 27 or the storage unit 25 via the converter 24.

The mode of operation of the thermoelectric converters 22 in normal mode is based on the Seebeck effect, so that a heat transport results in a current flow. During the inverse operation, a current flow by contrast leads to a heat transport, which is based on the Peltier effect.

The invention claimed is:

1. A method for operating a combustion engine comprising:
at least one exhaust manifold comprising:
an exhaust channel for conducting exhaust gas having an inlet side configured for connection to the combustion engine and an outlet side,
at least one coolant channel for conducting coolant, which is arranged on the outside of the exhaust channel and configured for connection to a cooling circuit,
at least one thermoelectric converter which is coupled on the one hand to the exhaust channel and on the other hand to the coolant channel in a heat-transferring manner; and
at least one exhaust system connected to the exhaust manifold;
wherein each of the at least one coolant channel is connected to a cooling circuit; and
wherein the cooling circuit is a cooling circuit of the combustion engine for cooling an engine block, or wherein the cooling circuit is a cooling circuit that can be controlled separately from the cooling circuit of the combustion engine;
the method comprising:
operating each of the at least one thermoelectric converter to generate electric energy during a hot operation of the combustion engine; and
operating each of the at least one thermoelectric converter to generate heat during a cold start operation of the combustion engine.

2. An exhaust manifold for an exhaust system of a combustion engine, in particular of a motor vehicle, comprising:
an exhaust channel for conducting exhaust gas having an inlet side configured for connection to the combustion engine and an outlet side configured for connection to the exhaust system,
at least one coolant channel for conducting coolant, which is arranged on the outside of the exhaust channel and configured for connection to a cooling circuit,
at least one thermoelectric converter which is coupled on the one hand to the exhaust channel and on the other hand to the coolant channel in a heat-transferring manner,
wherein a controller for operating the at least one thermoelectric converter is provided, which during a hot operation of the combustion engine operates each of the at least one thermoelectric converter for generating electric energy and which during a cold start operation of the combustion engine operates each of the at least one thermoelectric converter for generating heat.

3. The exhaust manifold according to claim 2, wherein along the outside of the exhaust channel a plurality of thermoelectric converters are arranged in a distributed manner, which are electrically interconnected via a cabling, or wherein each of the at least one thermoelectric converters is connected to an electric cabling, which is led out of the exhaust manifold.

4. The exhaust manifold according to claim 2 wherein the exhaust channel on its inside comprises at least one stiffening structure for stiffening the exhaust channel, wherein the at least one such stiffening structure supports two walls of the exhaust channel located opposite each other on each other, or wherein the exhaust channel on its inside comprises at least one heat transfer structure for improving the heat transfer between exhaust channel and exhaust gas.

5. The exhaust manifold according to claim 2, wherein the exhaust channel on its inside comprises at least one stiffening structure for stiffening the exhaust channel, which in addition is configured as heat transfer structure for improving the heat transfer between exhaust channel and exhaust gas, wherein the least one such stiffening structure supports two walls of the exhaust channel located opposite each other on each other.

6. An exhaust manifold for an exhaust system of a combustion engine, in particular of a motor vehicle, comprising:
an exhaust channel for conducting exhaust gas having an inlet side configured for connection to the combustion engine and an outlet side configured for connection to the exhaust system,
at least one coolant channel for conducting coolant, which is arranged on the outside of the exhaust channel and configured for connection to a cooling circuit,
at least one thermoelectric converter which is coupled on the one hand to the exhaust channel and on the other hand to the coolant channel in a heat-transferring manner, and
wherein the respective at least one thermoelectric converter is annularly enclosed by a thermal insulation between the exhaust channel and each of the at least one coolant channel, wherein adjacent thermoelectric converters are thermally insulated against each other.

7. A combustion engine, in particular of a motor vehicle, comprising:
at least one exhaust manifold comprising:
an exhaust channel for conducting exhaust gas having an inlet side configured for connection to the combustion engine and an outlet side,
at least one coolant channel for conducting coolant, which is arranged on the outside of the exhaust channel and configured for connection to a cooling circuit,
at least one thermoelectric converter which is coupled on the one hand to the exhaust channel and on the other hand to the coolant channel in a heat-transferring manner,
at least one exhaust system connected to the exhaust manifold;
wherein each of the at least one coolant channel is connected to a cooling circuit;
wherein the cooling circuit is a cooling circuit of the combustion engine for cooling an engine block, or wherein the cooling circuit is a cooling circuit that can be controlled separately from the cooling circuit of the combustion engine.

8. The combustion engine according to claim 7, wherein the cooling circuit connected to each of the at least one coolant channel comprises a coolant pump, wherein a controller is provided which controls a rate of delivery of the coolant pump as a function of a cooling requirement of each of the at least one coolant channel, or wherein an exhaust gas turbocharger is provided which is connected to a cooling circuit, wherein the respective coolant channel is connected to the same cooling circuit to which the exhaust gas turbocharger is also connected.

9. An exhaust manifold for an exhaust system of a combustion engine, in particular of a motor vehicle, comprising:
an exhaust channel for conducting exhaust gas having an inlet side configured for connection to the combustion engine and an outlet side configured for connection to the exhaust system, at least one coolant channel for conducting coolant, which is arranged on the outside of the exhaust channel and configured for connection to a cooling circuit, at least one thermoelectric converter which is coupled on the one hand to the exhaust channel and on the other hand to the coolant channel in a heat-transferring manner, and wherein each of the at least one coolant channel is configured as a pressure body and presses the respective at least one thermoelectric converter against the exhaust channel by means of spring force.

10. The exhaust manifold according to claim 9, wherein each of the at least one coolant channel comprises at least one outer shell for supporting preload forces and an inner shell for supporting the respective at least one coolant channel on the respective at least one thermoelectric converter.

11. An exhaust manifold for an exhaust system of a combustion engine, in particular of a motor vehicle, comprising:

an exhaust channel for conducting exhaust gas having an inlet side configured for connection to the combustion engine and an outlet side configured for connection to the exhaust system, at least one coolant channel for conducting coolant, which is arranged on the outside of the exhaust channel and configured for connection to a cooling circuit, at least one thermoelectric converter which is coupled on the one hand to the exhaust channel and on the other hand to the coolant channel in a heat-transferring manner, and wherein each of the at least one coolant channel is configured as a pressure body and presses the respective at least one thermoelectric converter against the exhaust channel in particular by means of spring force, and wherein the at least one coolant channel comprises at least two coolant channels each configured as a pressure body, between which the exhaust channel and each of the at least one thermoelectric converter are arranged and which are preloaded towards each other, in particular by means of spring force, in order to press the respective at least one thermoelectric converter against the exhaust channel.

12. The exhaust manifold according to claim 11, wherein between the at least two coolant channels at least two thermoelectric converters are arranged on both sides of the exhaust channel and are pressed against each other with the help of the coolant channels, or wherein the at least two coolant channels are preloaded towards each other with the help of at least one tensile anchor.

13. An exhaust manifold for an exhaust system of a combustion engine, in particular of a motor vehicle, comprising:

an exhaust channel for conducting exhaust gas having an inlet side configured for connection to the combustion engine and an outlet side configured for connection to the exhaust system, at least one coolant channel for conducting coolant, which is arranged on the outside of the exhaust channel and configured for connection to a cooling circuit, at least one thermoelectric converter which is coupled on the one hand to the exhaust channel and on the other hand to the coolant channel in a heat-transferring manner, wherein each of the at least one coolant channel comprises at least one outer shell for supporting preload forces and an inner shell for supporting each of the at least one coolant channel on the respective at least one thermoelectric converter, and wherein at least one tensile anchor for introducing the preload forces into the at least one outer shell is provided, wherein the at least one tensile anchor penetrates the respective at least one coolant channel inner shell and outer shell and is supported on an outer side of the outer shell facing away from the inner shell.

14. The exhaust manifold according to claim 13, wherein each of the at least one coolant channel comprises a sleeve, which separates through-openings penetrated by the respective at least one tensile anchor from an interior space of the respective at least one coolant channel through which coolant can flow.

15. The exhaust manifold according to claim 13, wherein the respective tensile anchor comprises at least one spring element or is formed through the respective at least one spring element, wherein the respective spring element is configured as one of a wave spring, a bellows spring, a C-spring, a Ω-spring or a pipe spring.

* * * * *